(12) United States Patent
Furuto

(10) Patent No.: US 10,056,771 B2
(45) Date of Patent: Aug. 21, 2018

(54) CONTROL SYSTEM

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventor: Ken Furuto, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 437 days.

(21) Appl. No.: 14/910,953

(22) PCT Filed: Aug. 12, 2014

(86) PCT No.: PCT/JP2014/071270
§ 371 (c)(1),
(2) Date: Feb. 8, 2016

(87) PCT Pub. No.: WO2015/029769
PCT Pub. Date: Mar. 5, 2015

(65) Prior Publication Data
US 2016/0204633 A1 Jul. 14, 2016

(30) Foreign Application Priority Data
Aug. 30, 2013 (JP) .................................. 2013-179756

(51) Int. Cl.
*H02J 7/00* (2006.01)
*G01R 31/02* (2006.01)
(Continued)

(52) U.S. Cl.
CPC ............ *H02J 7/0031* (2013.01); *G01R 31/02* (2013.01); *G01R 31/024* (2013.01); *G01R 31/40* (2013.01);
(Continued)

(58) Field of Classification Search
CPC ..................................................... H02J 7/0031
(Continued)

(56) References Cited

U.S. PATENT DOCUMENTS 5,929,538 A * 7/1999 O'Sullivan ........... H02J 7/1415
307/44
6,208,931 B1 * 3/2001 Schoettle ............... B60K 25/00
290/40 C
(Continued)

FOREIGN PATENT DOCUMENTS

JP H09-222448 A 8/1997
JP 2008-232871 A 10/2008
(Continued)

OTHER PUBLICATIONS

Sep. 16, 2014 Search Report issued in International Application No. PCT/JP2014/071270.

*Primary Examiner* — Yalkew Fantu
(74) *Attorney, Agent, or Firm* — Oliff PLC

(57) ABSTRACT

Provided is a control system that can appropriately determine whether or not supply of power to a load is abnormal, and can specify a detailed reason of the abnormality. A control circuit supplies power to a load and shuts off the supply of power in accordance with a power supply/shutoff instruction to supply or shut off power from a battery to the load. The power supply/shutoff instruction is output from a microcomputer to the control circuit. A control unit determines whether or not the supply of power from the battery to the load is abnormal, based on (i) whether the power (Continued)

supply/shutoff instruction output from the output unit is to supply power or shut off the supply of power, (ii) the value of a current flowing from the battery to the load, and (iii) the value of a voltage applied to the load, and specifies a reason of the abnormality.

6 Claims, 8 Drawing Sheets

(51) Int. Cl.
G01R 31/40 (2014.01)
H02J 7/14 (2006.01)
(52) U.S. Cl.
CPC ............ *H02J 7/00* (2013.01); *H02J 7/0047* (2013.01); *H02J 7/0063* (2013.01); *H02J 7/1461* (2013.01); *H02J 2007/0039* (2013.01); *H02J 2007/0067* (2013.01)
(58) Field of Classification Search
USPC .......................................................... 320/136
See application file for complete search history.

(56) References Cited

U.S. PATENT DOCUMENTS

| | | | | |
|---|---|---|---|---|
| 6,724,100 | B1* | 4/2004 | Gabriel | B60K 6/48 180/65.1 |
| 2003/0044689 | A1* | 3/2003 | Miyazaki | B60L 11/185 429/320 |
| 2004/0231897 | A1* | 11/2004 | Kimura | B60K 6/365 180/65.235 |
| 2008/0232015 | A1* | 9/2008 | Wakabayashi | B60T 8/321 361/79 |
| 2011/0290580 | A1 | 12/2011 | Mukai et al. | |
| 2013/0249696 | A1* | 9/2013 | Ikuta | H02H 3/085 340/593 |
| 2014/0339900 | A1* | 11/2014 | Shinomoto | H02H 3/066 307/66 |

FOREIGN PATENT DOCUMENTS

| | | |
|---|---|---|
| JP | 2011-250618 A | 12/2011 |
| JP | 2012-122869 A | 6/2012 |

* cited by examiner

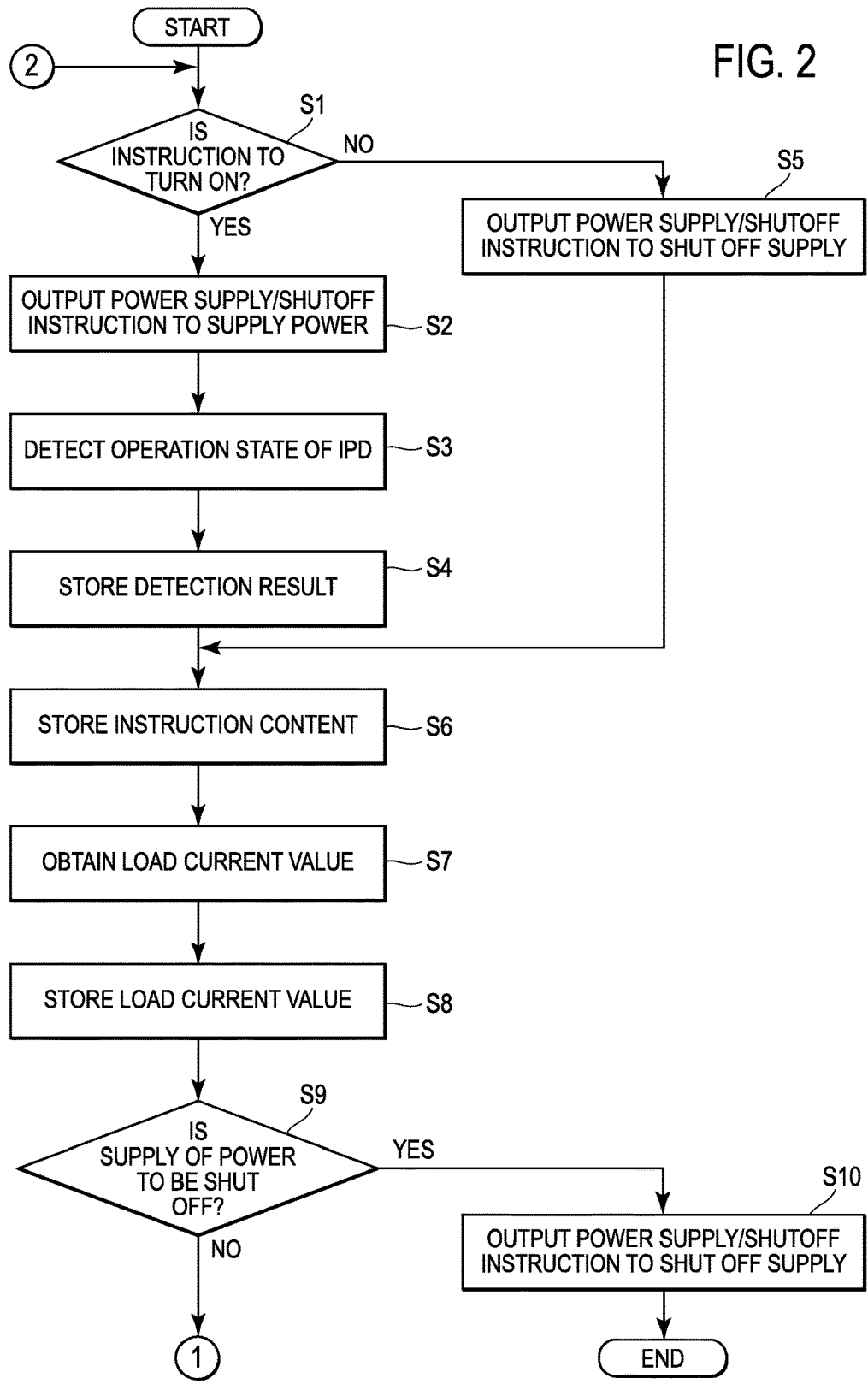

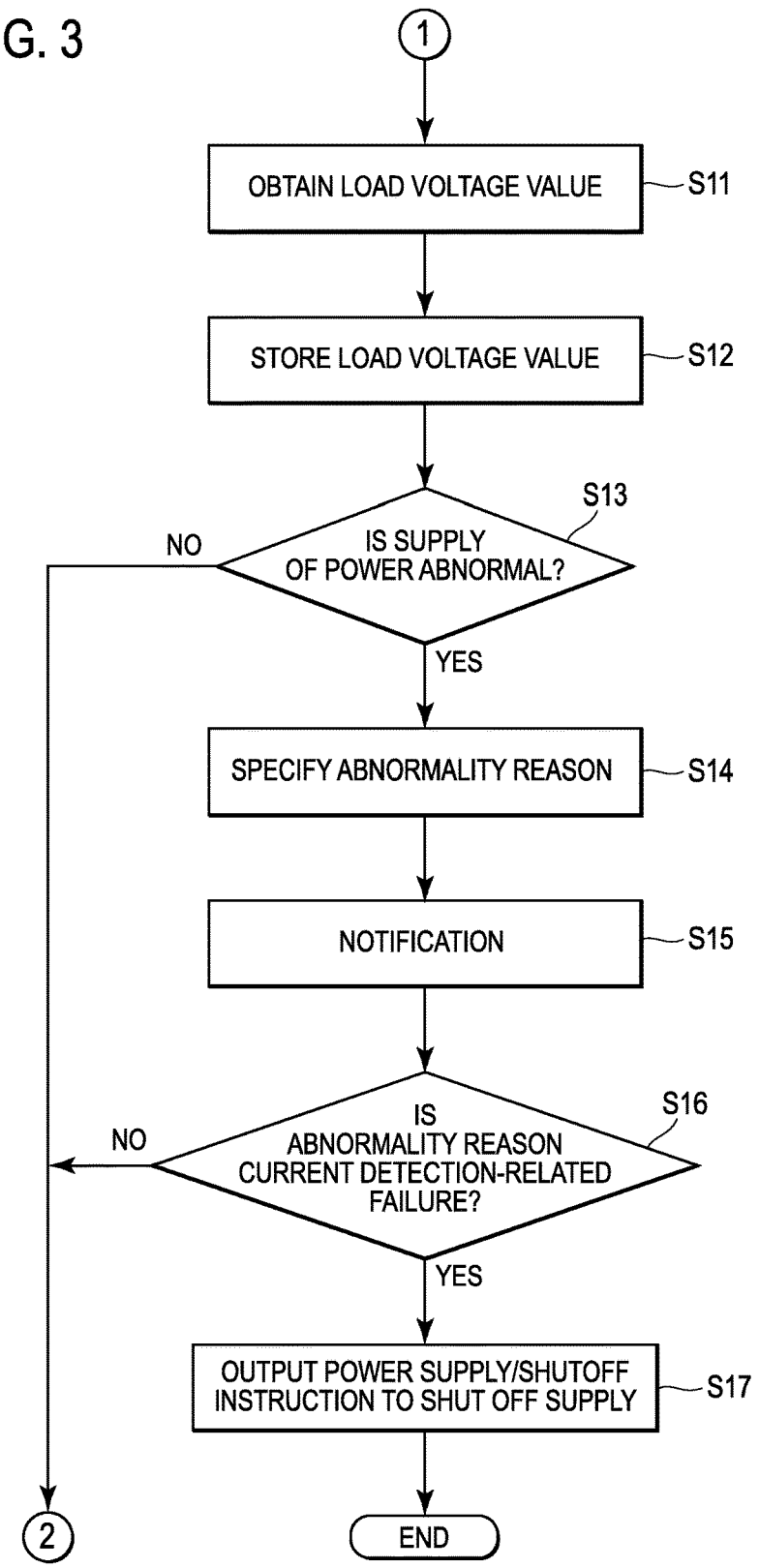

FIG. 4

| CONTENT OF INSTRUCTION OF CONTROL UNIT | OPERATION STATE OF IPD | LOAD CURRENT VALUE | LOAD VOLTAGE VALUE | SUPPLY OF POWER TO LOAD | REASON OF ABNORMALITY |
|---|---|---|---|---|---|
| SHUTOFF | ∞ | H | H | ABNORMAL | SHORT CIRCUIT OF FET |
| SHUTOFF | ∞ | H | L | ABNORMAL | CURRENT DETECTION - RELATED FAILURE |
| SHUTOFF | ∞ | L | H | ABNORMAL | SHORT CIRCUIT OF LOAD |
| SHUTOFF | ∞ | L | L | NORMAL | |
| SUPPLY OF POWER | SUPPLY IS BEING SHUT OFF | H | H | ABNORMAL | SHORT CIRCUIT OF FET OR COMMUNICATION ERROR |
| SUPPLY OF POWER | SUPPLY IS NOT SHUT OFF | H | H | NORMAL | |
| SUPPLY OF POWER | SUPPLY IS BEING SHUT OFF | H | L | ABNORMAL | CURRENT DETECTION - RELATED FAILURE |
| SUPPLY OF POWER | SUPPLY IS NOT SHUT OFF | H | L | ABNORMAL | SHORT CIRCUIT OF LOAD |
| SUPPLY OF POWER | SUPPLY IS BEING SHUT OFF | L | H | ABNORMAL | SHORT CIRCUIT OF LOAD |
| SUPPLY OF POWER | SUPPLY IS NOT SHUT OFF | L | H | ABNORMAL | OPENING OF LOAD, OR CURRENT DETECTION - RELATED FAILURE |
| SUPPLY OF POWER | SUPPLY IS BEING SHUT OFF | L | L | NORMAL | |
| SUPPLY OF POWER | SUPPLY IS NOT SHUT OFF | L | L | ABNORMAL | OPENING OF FET |

FIG. 8

| CONTENT OF INSTRUCTION OF CONTROL UNIT | LOAD CURRENT VALUE | LOAD VOLTAGE VALUE | SUPPLY OF POWER TO LOAD | REASON OF ABNORMALITY |
|---|---|---|---|---|
| SHUTOFF | H | H | ABNORMAL | SHORT CIRCUIT OF FET |
| SHUTOFF | H | L | ABNORMAL | CURRENT DETECTION - RELATED FAILURE |
| SHUTOFF | L | H | ABNORMAL | SHORT CIRCUIT OF LOAD |
| SHUTOFF | L | L | NORMAL | |
| SUPPLY OF POWER | H | H | NORMAL | |
| SUPPLY OF POWER | H | L | ABNORMAL | SHORT CIRCUIT OF LOAD |
| SUPPLY OF POWER | L | H | ABNORMAL | OPENING OF LOAD, OR CURRENT DETECTION - RELATED FAILURE |
| SUPPLY OF POWER | L | L | ABNORMAL | OPENING OF FET |

CONTROL SYSTEM

TECHNICAL FIELD

Aspects of the present disclosure relate to a control system including an instruction output device that outputs a power supply/shutoff instruction to supply power from a battery to a load or to shut off the supply of power, and a power supply control device that supplies power to the load and shuts off the supply of power in accordance with the power supply/shutoff instruction that is output by the instruction output device.

BACKGROUND ART

Recently, control systems have been proposed that include an instruction output device that outputs a power supply/shutoff instruction to supply power from a battery to a load or to shut off the supply of power, and a power supply control device that supplies power to the load and shuts off the supply of power in accordance with the power supply/shutoff instruction that is output by the instruction output device (see Patent Document 1).

In the control system disclosed in Patent Document 1, the power supply control device supplies power and shuts off the supply of power by switching on/off a switch that is provided midway on an electric wire connecting the battery and the load. A turning on/off instruction to turn on or off the load is input to the instruction output device from the outside, and the instruction output device outputs the power supply/shutoff instruction that corresponds to the input turning on/off instruction to the power supply control device. Furthermore, the instruction output device calculates the temperature of the electric wire based on the value of a current flowing from the battery to the load.

In the control system disclosed in Patent Document 1, if in the state in which the power supply control device is instructed to supply power, the temperature of the electric wire that was calculated based on the value of the current flowing from the battery to the load does not increase for a predetermined time period, the instruction output device determines that there is an abnormality in a load circuit including the battery, the switch, the power supply control device, and the load, and specifies that the reason of the abnormality is wire breakage (open circuit). As described above, in the control system disclosed in Patent Document 1, the instruction output device determines whether or not the supply of power to the load is abnormal based on the value of the current flowing from the battery to the load, and specifies, if it is determined that the supply is abnormal, the reason of the abnormality.

CITATION LIST

Patent Documents

Patent Document 1: JP 2012-122869A

SUMMARY

However, the control system disclosed in Patent Document 1 cannot specify the detailed reason of the abnormality, for example, which of the switch and the load of the load circuit is open.

The control system disclosed in Patent Document 1 appears to be able to specify a short circuit of the load circuit as the reason of the abnormality in the supply of power to the load, based on the value of a current flowing from the battery to the load. Even in this case, however, it is not possible to specify the detailed reason of the abnormality, for example, which of the switch and the load of the load circuit is short-circuited.

Accordingly, the control system disclosed in Patent Document 1 has the problem that it takes a long time to find, after the determination that the supply of power to the load is abnormal, the position of the abnormality, thus causing a lot of trouble with the repair.

Present embodiments were made in view of the above-described problem, and it is an object of some embodiments to provide a control system that can appropriately determine whether or not supply of power to a load is abnormal, and can specify the detailed reason of the abnormality.

A control system according to a preferred embodiment includes: a power supply control device for supplying and shutting off power in accordance with a power supply/shutoff instruction to supply power from a battery to a load or to shut off the supply of power; and an instruction output device for outputting the power supply/shutoff instruction to the power supply control device, wherein the power supply control device includes
current detection means for detecting a current flowing from the battery to the load, and
the instruction output device includes:
voltage detection means for detecting a voltage applied to the load;
determination means for determining whether or not the supply of power is abnormal, based (i) on whether the power supply/shutoff instruction that is output to the power supply control device is to supply power or to shut off the supply of power, (ii) a value of the current detected by the current detection means, and a (iii) value of the voltage detected by the voltage detection means; and
specification means for, if it is determined by the determination means that the supply of power is abnormal, specifying a reason of the abnormality based on (i) whether the power supply/shutoff instruction output to the power supply control device is to supply power or to shut off the supply of power, (ii) the value of the current detected by the current detection means, and (iii) the value of the voltage detected by the voltage detection means.

According to aspects of preferred embodiments, the instruction output device outputs, to the power supply control device, the power supply/shutoff instruction to supply power from a battery to a load or to shut off the supply of power, and the power supply control device supplies power from the battery to the load and shuts off the supply of power in accordance with the power supply/shutoff instruction input from the instruction output device. The power supply control device detects a current flowing from the battery to the load, and the instruction output device detects a voltage applied to the load.

The instruction output device determines whether or not the supply of power to the load is abnormal, based on (i) whether the power supply/shutoff instruction that is output to the power supply control device is to supply power or to shut off the supply of power, (ii) the value of the current detected by the current detection means, and (iii) the value of the voltage detected by the voltage detection means. If it is determined that the supply of power is abnormal, the instruction output device specifies a reason of the abnormality based on (i) whether the power supply/shutoff instruction output to the power supply control device is to supply power or to shut off the supply of power, (ii) the value of the current detected by the current detection means, and (iii) the value of the voltage detected by the voltage detection means.

Accordingly, it is appropriately determined whether or not the supply of power to the load is abnormal based on not only the value of the current flowing from the battery to the load but also the value of the voltage applied to the load, and the detailed reason thereof is specified.

The control system according to the preferred embodiments may be configured such that the power supply control device further includes shutoff means for shutting off the supply of power regardless of the power supply/shutoff instruction that is output by the instruction output device, if the value of the current detected by the current detection means is a predetermined value or more, the instruction output device further includes detection means for detecting whether or not the shutoff means is shutting off the supply of power, the determination means determines whether or not the supply of power is abnormal, based on (i) whether the power supply/shutoff instruction that is output to the power supply control device is to supply power or to shut off the supply of power, (ii) the value of the current detected by the current detection means, (iii) the value of the voltage detected by the voltage detection means, and (iv) a result of the detection of the detection means, and the specification means specifies the reason based on (i) whether the power supply/shutoff instruction output to the power supply control device is to supply power or to shut off the supply of power, (ii) the value of the current detected by the current detection means, (iii) the value of the voltage detected by the voltage detection means, and (iv) the result of the detection of the detection means.

According to a preferred embodiment, if the detected current value is a predetermined value or more due to, for example, an overcurrent flowing from the battery to the load, the power supply control device will shut off the supply of power regardless of the power supply/shutoff instruction input from the instruction output device. The instruction output device detects whether or not the power supply control device is shutting off the supply of power regardless of the power supply/shutoff instruction.

The instruction output device determines whether or not the supply of power to the load is abnormal, based on not only whether the power supply/shutoff instruction that is output to the power supply control device is to supply power or to shut off the supply of power, the value of the current flowing from the battery to the load, and the value of the voltage applied to the load, but also the result of the detection whether or not the power supply control device is shutting off the supply of power regardless of the power supply/shutoff instruction. Furthermore, the instruction output device specifies the reason of the abnormality based on not only whether the power supply/shutoff instruction that is output to the power supply control device is to supply power or to shut off the supply of power, the value of the current flowing from the battery to the load, and the value of the voltage applied to the load, but also the result of the detection whether or not the power supply control device is shutting off the supply of power regardless of the power supply/shutoff instruction.

Accordingly, a more detailed reason of the abnormality is specified.

The control system according to a preferred embodiment, may be configured such that the instruction output device further includes notification means for, if it is determined by the determination means that the supply of power is abnormal, issuing a notification of the reason specified by the specification means.

According to a preferred embodiment, if it is determined that the supply of power is abnormal, the instruction output device issues a notification of the specified reason. Accordingly, it is possible for a user to recognize an abnormality in the supply of power to the load, and the reason of this abnormality.

The control system according to a preferred embodiment may be configured such that the instruction output device further includes:

input means for receiving a turning on/off instruction to turn on or off the load; and second determination means for determining whether or not the supply of power is to be shut off, based on the value of the current detected by the current detection means, and the instruction output device outputs, to the power supply control device, the power supply/shutoff instruction that corresponds to the turning on/off instruction input to the input means, and if it is determined by the second determination means that the supply of power is to be shut off, the instruction output device outputs, to the power supply control device, the power supply/shutoff instruction to shut off the supply of power regardless of the turning on/off instruction input to the input means.

According to a preferred embodiment, a turning on/off instruction to turn on or off the load is input to the instruction output device, and the instruction output device outputs the power supply/shutoff instruction that corresponds to the input turning on/off instruction to the power supply control device. Furthermore, the instruction output device determines whether or not the supply of power from the battery to the load is to be shut off based on the value of the current detected by the power supply control device. For example, the instruction output device calculates the temperature of an electric wire connecting the battery and the load based on the value of the current detected by the power supply control device, and determines that the supply of power is to be shut off if the calculated temperature is a predetermined temperature or more.

If it is determined that the supply of power from the battery to the load is to be shut off, the instruction output device outputs the power supply/shutoff instruction to shut off the supply of power to the power supply control device regardless of the input turning on/off instruction. Accordingly, the power supply control device shuts off the supply of power, preventing the electric wire connecting the battery and the load from emitting smoke.

Advantageous Effects

According to a preferred embodiment, it is possible to appropriately determine whether or not supply of power to a load is abnormal, based on not only a value of a current flowing from a battery to the load but also a value of a voltage applied to the load.

BRIEF DESCRIPTION OF DRAWINGS

FIG. 2 is a flowchart illustrating a procedure of an operation executed by a control unit.

FIG. 3 is a flowchart illustrating a procedure of the operation executed by the control unit.

FIG. 4 shows a table for illustrating determination of an abnormality and specification of the reason of the abnormality.

FIG. 8 shows a table for illustrating determination of an abnormality and specification of the reason of the abnormality.

DESCRIPTION OF EMBODIMENTS

Hereinafter, the present disclosure will be described in detail with reference to the drawings illustrating embodiments thereof.

Embodiment 1

Figure 1:
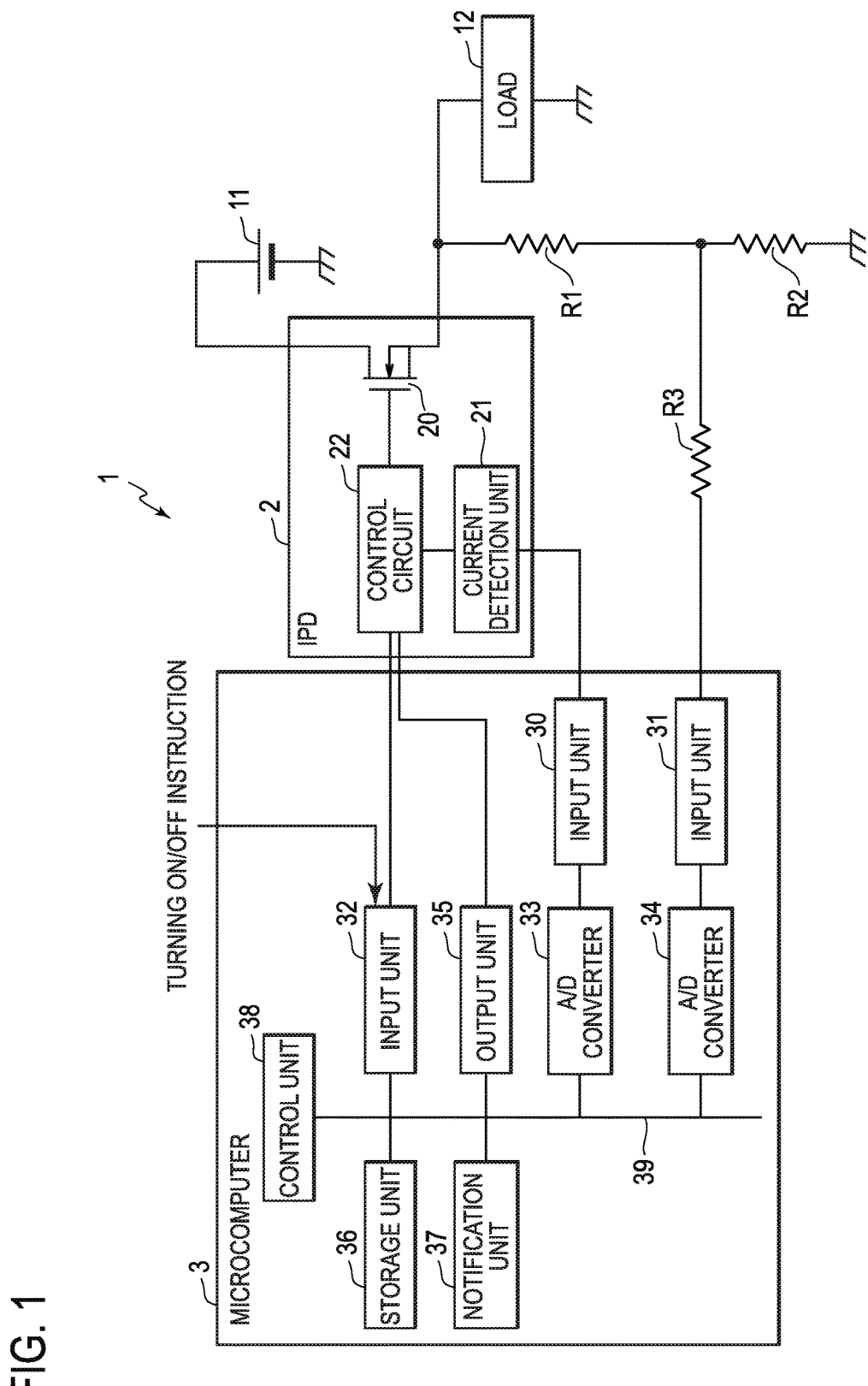
FIG. 1 is a block diagram illustrating a configuration of a main part of a control system according to Embodiment 1.

FIG. 1 is a block diagram illustrating a configuration of a main part of a control system according to Embodiment 1. This control system 1 is preferably installed in a vehicle, and includes an IPD (Intelligent Power Device) 2 and a microcomputer 3.

The IPD 2 is connected between the positive terminal of a battery 11 and one end of a load 12. The IPD 2 is further connected to the microcomputer 3. One end of a resistor R1 is connected to a connection node between the IPD 2 and the one end of the load 12, and the other end of the resistor R1 is connected to respective ends of resistors R2 and R3. The other end of the resistor R3 is connected to the microcomputer 3. The negative terminal of the battery 11, the other end of the load 12, and the other end of the resistor R2 are grounded.

A power supply/shutoff instruction to supply power from the battery 11 to the load 12 or to shut off the supply of power is input to the IPD 2 from the microcomputer 3. The IPD 2 supplies power from the battery 11 to the load 12 and shuts off the supply of power in accordance with the input power supply/shutoff instruction. The IPD 2 serves as the power supply control device.

A turning on/off instruction to turn on or off the load 12 is externally inputted to the microcomputer 3. The microcomputer 3 outputs, to the IPD 2, a power supply/shutoff instruction that corresponds to the turning on/off instruction externally input. The microcomputer 3 serves as the instruction output device.

The resistors R1 and R2 divide a load voltage applied to the load 12, and the voltage divided by the resistors R1 and R2 is input to the microcomputer 3 via the resistor R3.

The load 12 is electrical equipment such as a head light or a wiper that is mounted on the vehicle. The load 12 is turned on when being supplied with power from the battery 11, and is turned off when the supply of power from the battery 11 is shut off.

The IPD 2 includes an N-channel type FET (Field Effect Transistor) 20, a current detection unit 21, and a control circuit 22. The FET 20 has a drain connected to the positive terminal of the battery 11, a source connected to the respective ends of the load 12 and the resistor R1, and a gate connected to the control circuit 22. The control circuit 22 is connected to not only the gate of the FET 20 but also the microcomputer 3 and the current detection unit 21. The current detection unit 21 is connected to not only the control circuit 22 but also the microcomputer 3.

The FET 20 serves as a switch. When a voltage of a predetermined magnitude or more is applied to the gate, the FET 20 is turned on, so that a current flows to the gate from the drain, and when the voltage applied to the gate is less than the predetermined magnitude, the FET 20 is turned off, so that no current flows to the gate from the drain. The application of a voltage to the gate of the FET 20 is performed by the control circuit 22, and the control circuit 22 turns on/off the FET 20 by adjusting the voltage applied to the gate of the FET 20.

The current detection unit 21 detects a load current that flows from the positive terminal of the battery 11 to the one end of the load 12, and outputs analog current value data indicating the detected load current value to the control circuit 22 and the microcomputer 3. The current detection unit 21 serves as current detection means.

To be exact, the current detection unit 21 detects the sum total of the values of currents flowing from the positive terminal of the battery 11 to the load 12 and the resistors R1 and R2, in order to detect the value of a current flowing out of the source of the FET 20. However, because the combined resistance value obtained by summing up the resistance values of the resistors R1 and R2 is sufficiently larger than the resistance value between both ends of the load 12, most part of the current flowing out of the source of the FET 20 flows to the load 12, and the current that flows to the resistors R1 and R2 hardly exists and is negligibly small.

A power supply/shutoff instruction is input to the control circuit 22 from the microcomputer 3. If the input power supply/shutoff instruction is to supply power, the control circuit 22 turns the FET 20 on, and supplies power from the battery 11 to the load 12. If the input power supply/shutoff instruction is to shut off the supply of power, the control circuit 22 turns the FET 20 off, and shuts off the supply of power from the battery 11 to the load 12.

The current value data is input to the control circuit 22 from the current detection unit 21. If the load current value indicated by the input current value data is a predetermined current value or more, the control circuit 22 turns the FET 20 off regardless of the power supply/shutoff instruction that is output from the microcomputer 3, and shuts off the supply of power from the battery 11 to the load 12. The control circuit 22 serves as shutoff means.

If the supply of power from the battery 11 to the load 12 is shut off regardless of the power supply/shutoff instruction, the control circuit 22 outputs, to the microcomputer 3, a shutoff signal indicating that the supply of power was shut off. After having shut off the supply of power from the battery 11 to the load 12 regardless of the power supply/shutoff instruction, the control circuit 22 cancels the shutting-off if a predetermined condition is satisfied, and outputs a cancellation signal indicating that the shutting-off was cancelled to the microcomputer 3. Here, the predetermined condition is that if, for example, a temperature sensor (not shown) that detects the temperature in the vicinity of the electric wire connecting the battery 11 and the load 12 is provided, the temperature value detected by the temperature sensor is less than a predetermined temperature value.

The microcomputer 3 includes input units 30, 31, and 32, A/D (Analog/Digital) converters 33 and 34, an output unit 35, a storage unit 36, a notification unit 37, and a control unit 38. The input unit 30 is connected to the current detection unit 21 of the IPD 2 and to the A/D converter 33. The input unit 31 is connected to the other end of the resistor R3 and to the A/D converter 34. The input unit 32, the A/D converters 33 and 34, the output unit 35, the storage unit 36, the notification unit 37, and the control unit 38 are connected to a bus 39. The input unit 32 and the output unit 35 are connected to not only the bus 39 but also the control circuit 22 of the IPD 2.

The analog current value data is input to the input unit 30 from the current detection unit 21. The input unit 30 outputs the input analog current value data to the A/D converter 33.

The A/D converter 33 converts the analog current value data input from the input unit 30 into digital current value data, and outputs the converted current value data to the control unit 38.

The voltage divided by the resistors R1 and R2 is input to the input unit 31 via the resistor R3. The input unit 31 detects the voltage divided by the resistors R1 and R2. The detection of a voltage divided by the resistors R1 and R2 corresponds to detection of a load voltage that is applied to both ends of the load 12.

This is because a load voltage value is obtained by multiplying the value of the voltage divided by the resistors R1 and R2 by (r1+r2)/r2, where r1 and r2 are respectively the resistance values of the resistors R1 and R2. For example, if the resistance values r1 and r2 are respectively 5 kΩ and 10 kΩ, the load voltage value is calculated by multiplying the voltage value detected by the input unit 31 by 1.5. The input unit 31 serves as voltage detection means.

The input unit 31 gives the detected analog voltage value to the A/D converter 34.

The A/D converter 34 converts the analog voltage value given by the input unit 31 into a digital voltage value, and notifies the control unit 38 of the converted voltage value.

The shutoff signal and the cancellation signal are input to the input unit 32 from the control circuit 22 of the IPD 2, and the turning on/off instruction is input to the input unit 32 from the outside. The input unit 32 serves as input means.

When the shutoff signal is input from the control circuit 22, the input unit 32 notifies the control unit 38 of the fact that the control circuit 22 is shutting off the supply of power from the battery 11 to the load 12 regardless of the power supply/shutoff instruction. Furthermore, when the cancellation signal is input from the control circuit 22, the input unit 32 notifies the control unit 38 of the fact that the control circuit 22 has cancelled the shut-off that was made regardless of the power supply/shutoff instruction.

The input unit 32 notifies the control unit 38 of whether the turning on/off instruction input from the outside is an instruction to turn on or an instruction to turn off.

The output unit 35 outputs the power supply/shutoff instruction to the control circuit 22 of the IPD 2 in accordance with the instruction of the control unit 38.

The storage unit 36 is a nonvolatile memory and a content stored in the storage unit 36 is written and read by the control unit 38.

The notification unit 37 issues a notification in accordance with the instruction of the control unit 38. The notification unit 37 issues a notification by, for example, displaying a message on a display unit (not shown).

The control unit 38 instructs the output unit 35 to output, to the control circuit 22 of the IPD 2, the power supply/turnoff instruction that corresponds to the turning on/off instruction input to the input unit 32.

Furthermore, the control unit 38 determines whether or not the supply of power from the battery 11 to the load 12 is to be shut off, based on the load current value indicated by the current value data converted by the A/D converter 33, that is, the load current value detected by the current detection unit 21 of the IPD 2. The control unit 38 lets the output unit 35 output the power supply/shutoff instruction based on the result of the determination. The control unit 38 serves as second determination means.

Furthermore, the control unit 38 determines whether or not the supply of power from the battery 11 to the load 12 is abnormal, based on (i) whether the power supply/shutoff instruction that is output from the output unit 35 to the control circuit 22 of the IPD 2 is to supply power or to shut off the supply of power, (ii) the load current value that is indicated by the current value data converted by the A/D converter 33, (iii) the voltage value converted by the A/D converter 34, and (iv) the shutoff signal and the cancellation signal that are input to the input unit 32. If it is determined that the supply is abnormal, the control unit 38 specifies the reason of the abnormality, and lets the notification unit 37 issue a notification of the specified reason.

Hereinafter, a detailed operation of the control unit 38 will be described. FIGS. 2 and 3 are flowcharts illustrating the procedure of the operation executed by the control unit 38. First, the control unit 38 determines whether or not the turning on/off instruction input to the input unit 32 from the outside is an instruction to turn on (step S1). If it is determined that the instruction is an instruction to turn on (YES in step S1), the control unit 38 instructs the output unit 35 to output, to the control circuit 22 of the IPD 2, the power supply/shutoff instruction to supply power (step S2). Accordingly, the control circuit 22 turns the FET 20 on, and supplies power from the battery 11 to the load 12.

Then, the control unit 38 detects an operation state of the IPD 2 based on the shutoff signal and the cancellation signal input from the control circuit 22 to the input unit 32 (step S3). Here, the operation state of the IPD 2 indicates whether or not the control circuit 22 of the IPD 2 is shutting off the supply of power from the battery 11 to the load 12 regardless of the power supply/shutoff instruction that is output from the output unit 35, and the control unit 38 also serves as detection means.

When the shutoff signal is input to the input unit 32, the control unit 38 detects that the control circuit 22 of the IPD 2 is shutting off the supply of power from the battery 11 to the load 12 regardless of the power supply/shutoff instruction that is output from the output unit 35. Furthermore, when the cancellation signal is input to the input unit 32, the control unit 38 detects that the control circuit 22 of the IPD 2 has cancelled the shut-off that was made regardless of the power supply/shutoff instruction, and is performing supply of power from the battery 11 to the load 12 and shut-off of the supply of power in accordance with the power supply/shutoff instruction that is output by the output unit 35.

Then, the control unit 38 stores, in the storage unit 36, the detection result that was detected in step S3, that is, whether or not the control circuit 22 of the IPD 2 is shutting off the supply regardless of the power supply/shutoff instruction (step S4).

Here, the storage unit 36 stores four items as the present control state.

The first item is an instruction content of a power supply/shutoff instruction for the control circuit 22 of the IPD 2 that the control unit 38 lets the output unit 35 output, specifically, which of supply of power and shut-off of the supply of power is instructed.

The second item is the above-described operation state of the IPD 2.

The third item is the load current value detected by the current detection unit 21 of the IPD 2, specifically, whether or not the load current value detected by the current detection unit 21 is a threshold Ith or more.

The fourth item is the value of a load voltage applied to both ends of the load 12, specifically, whether or not the load voltage value is a threshold Vth or more.

The threshold Ith is a current value that is lower than the value of a load current that flows when power is normally supplied by the control circuit 22 turning the FET 20 on, and is higher than the value of a load current that flows when the supply of power is normally shut off by the control circuit 22 turning the FET 20 off. Similarly, the threshold Vth is a value that is lower than the value of a load voltage when power is normally supplied by the control circuit 22 turning the FET 20 on, and is higher than the value of a load voltage when the supply of power is normally shut off by the control circuit 22 turning the FET 20 off.

In step S4, the control unit 38 stores the detection result, by rewriting the operation state of the IPD 2 that is stored as the present control state in the storage unit 36 into the detection result of the detection in step S3.

If the turning on/off instruction is not an instruction to turn on, that is, the turning on/off instruction is an instruction to turn off (NO in step S1), the control unit 38 instructs the output unit 35 to output, to the control circuit 22 of the IPD 2, the power supply/shutoff instruction to shut off the supply (step S5). Accordingly, the control circuit 22 turns the FET 20 off, and shuts off the supply of power from the battery 11 to the load 12.

After having executed step S4 or S5, the control unit 38 lets the output unit 35 output the power supply/shutoff instruction and thereby stores the content of the instruction given to the control circuit 22 of the IPD 2 (step S6). Specifically, after having executing step S2, the control unit 38 rewrites the content of the instruction stored as the present control state in the storage unit 36 into supply of power, and after having executed step S5, rewrites the content of the instruction stored as the present control state in the storage unit 36 into the shutoff state.

After having executed step S6, the control unit 38 obtains, from the A/D converter 33, the load current value indicated by the current value data converted by the A/D converter 33, that is, the load current value detected by the current detection unit 21 of the IPD 2 (step S7), and stores the obtained load current value as the current present control state in the storage unit 36 (step S8). Specifically, the control unit 38 stores, in the storage unit 36, whether or not the load current value obtained in step S7 is the threshold Ith or more. If the load current value is the threshold Ith or more, the control unit 38 stores the fact that the load current value is a high-level current value, and if the load current value is less than the threshold Ith, the control unit 38 stores the fact that the load current value is a low-level current value.

Then, based on the load current value obtained in step S7, the control unit 38 determines whether or not the supply of power from the battery 11 to the load 12 is to be shut off (step S9). In step S9, if, for example, the temperature of the electric wire connecting the positive terminal of the battery 11 and an end of the load 12 is calculated based on the load current value detected by the current detection unit 21, the control unit 38 determines whether or not the supply of power from the battery 11 to the load 12 is to be shut off based on whether or not the calculated temperature of the electric wire is a predetermined temperature or more.

In this case, if the calculated temperature of the electric wire is the predetermined temperature or more, the control unit 38 determines that there is a risk of the electric wire emitting smoke and the supply of power is to be shut off, and if the calculated temperature of the electric wire is less than the predetermined temperature, the control unit 38 determines that there is no risk of the electric wire emitting smoke and the supply of power is not to be shut off.

If it is determined that the supply of power is to be shut off (YES in step S9), the control unit 38 instructs the output unit 35 to output, to the control circuit 22 of the IPD 2, the power supply/shutoff instruction to shut off the supply of power from the battery 11 to the load 12 regardless of the turning on/off instruction input to the input unit 32 (step S10). In response thereto, the control circuit 22 turns the FET 20 off and shuts off the supply of power from the battery 11 to the load 12, making it possible to prevent, for example, the electric wire connecting the battery 11 and the load 12 from emitting smoke.

After the execution of step S10, the control unit 38 ends the procedure. In the case where the procedure ended after the execution of step S10, the control unit 38 reexecutes step S1 if, for example, a difference between the temperature of the electric wire connecting the battery 11 and the load 12 that was calculated based on (i) the load current value detected by the current detection unit 21, and (ii) the ambient temperature of the electric wire is less than a predetermined temperature.

If it is determined that the supply of power is not to be shut off (NO in step S9), the control unit 38 obtains the load voltage value by multiplying the voltage value converted by the A/D converter 34 by (r1+r2)/r2 (step S11), and stores the obtained load voltage value as the present control state in the storage unit 36 (step S12). Specifically, the control unit 38 stores, in the storage unit 36, whether or not the load voltage value obtained in step S11 is the threshold Vth or more. If the load voltage value is the threshold Vth or more, the control unit 38 stores the fact that the load voltage value is a high-level voltage value, and if the load voltage value is less than the threshold Vth, the control unit 38 stores the fact that the load voltage value is a low-level voltage value.

Then, the control unit 38 determines, based on the present control states stored in steps S4, S6, S8, and S12, whether or not the supply of power from the battery 11 to the load 12 is abnormal (step S13). The determination of an abnormality that is executed in step S13 will be described later.

If it is determined that the supply of power is not abnormal (NO in step S13), the control unit 38 returns the procedure to step S1, and performs supply of power from the battery 11 to the load 12 or shut-off of the supply of power, depending on the turning on/off instruction input to the input unit 32.

If it is determined that the supply of power is abnormal (YES in step S13), the control unit 38 specifies the reason of the abnormality based on the present control states stored in the storage unit 36 (step S14). Similarly to the determination of an abnormality, the specification of the reason of the abnormality will also be described later.

Then, the control unit 38 instructs the notification unit 37 to issue a notification of the reason of the abnormality that was specified in step S14 (step S15).

As described above, if the control unit 38 has determined that the supply of power from the battery 11 to the load 12 is abnormal, the notification unit 37 issues a notification of the reason of the abnormality that was specified by the control unit 38 in step S14. Accordingly, it is possible for a user to recognize an abnormality in the supply of power from the battery 11 to the load 12, and the reason of this abnormality. The notification unit 37 serves as notification means.

After the execution of step S15, the control unit 38 determines whether or not the reason of the abnormality that was specified in step S14 is a current detection-related failure (step S16). "Current detection-related failure" refers to false detection of the current detection unit 21, a false conversion of the A/D converter 33, or the like.

If it is determined that the reason of the abnormality is not a current detection-related failure (NO in step S16), the control unit 38 returns the procedure to step S1. If it is determined that the reason of the abnormality is a current detection-related failure (YES in step S16), the control unit 38 instructs the output unit 35 to output the power supply/shutoff instruction to shut off the supply regardless of the turning on/off instruction input to the input unit 32 (step S17). After the execution of step S17, the control unit 38 ends the procedure.

Next, the determination of an abnormality and the reason of the abnormality that are executed by the control unit 38 in steps S13 and S14 will be described. FIG. 4 shows a table for illustrating determination of an abnormality and specification of the reason of the abnormality. FIG. 4 shows whether the supply of power to the load 12 is abnormal or normal, and the reasons of the abnormality with respect to the control states that the control system 1 can hold. As described above, the control state is indicated with the content of the instruction given to the control circuit 22 of the IPD 2 by the control unit 38, the operation state of the IPD 2, the load current value, and the load voltage value. In FIG. 4, a high-level load current value is denoted with "H", and a low-level load current value is denoted with "L". In FIG. 4, the high-level load voltage value as well is denoted with "H", and the low-level load voltage value is denoted with "L".

As described above, the threshold Ith is a current value that is lower than the value of a load current that flows when power is normally supplied by the control circuit 22, and is higher than the value of a load current that flows when the supply of power is normally shut off by the control circuit 22. Similarly, the threshold Vth is a value that is lower than the load voltage value when power is normally supplied by the control circuit 22, and is higher than the load voltage value when the supply of power is normally shut off by the control circuit 22.

If the load current value is a high-level current value and the load voltage value is a high-level voltage value although the control circuit 22 is instructed to shut off the supply, the control unit 38 determines that the supply of power to the load 12 is abnormal, and specifies a short circuit of the FET 20 as the reason of the abnormality. "Short circuit of the FET 20" means that the FET 20 is always in the on state regardless of the voltage applied to the gate.

If the load voltage value is normally a low-level voltage value but the load current value is a high-level current value when the control circuit 22 is instructed to shut off the supply, the control unit 38 determines that the supply of power to the load 12 is abnormal, and specifies a current detection-related failure as the reason of the abnormality. Specifically, it is specified that at least one of the current detection unit 21 and the A/D converter 33 malfunctions.

If the load current value is normally a low-level current value but the load voltage value is a high-level voltage value when the control circuit 22 is instructed to shut off the supply, the control unit 38 determines that the supply of power to the load 12 is abnormal, and specifies a short circuit of the load 12 as the reason of the abnormality. The short circuit of the load 12 specified here is a short circuit that occurs because one end of the load 12 is directly connected to the positive terminal of the battery 11.

If the load current value is a low-level current value and the load voltage value is a low-level voltage value when the control circuit 22 is instructed to shut off the supply, the control unit 38 determines that power is normally supplied to the load 12.

If the control unit 38 instructs the control circuit 22 to shut off the supply, the determination of an abnormality and specification of a reason of the abnormality are not affected by whether or not the control circuit 22 of the IPD 2 is shutting off the supply regardless of the turning on/off instruction input to the input unit 32.

If the load current value is a high-level current value and the load voltage value is a high-level voltage value although the control circuit 22 is instructed to supply power and the IPD 2 is shutting off the supply regardless of the turning on/off instruction, the control unit 38 determines that the supply of power to the load 12 is abnormal, and specifies a short circuit of the FET 20 or a communication error as the reason of the abnormality. "Communication error" means that communication between the control circuit 22 of the IPD 2 and the input unit 32 of the microcomputer 3 is not normally conducted, and none of a shutoff signal and a cancellation signal is normally output from the control circuit 22 to the input unit 32.

If the load current value is a high-level current value and the load voltage value is a high-level voltage value when the control circuit 22 is instructed to supply power and the IPD 2 is not shutting off the supply regardless of the turning on/off instruction, the control unit 38 determines that the supply of power to the load 12 is normal.

If the load voltage value is normally a low-level voltage value but the load current value is a high-level current value when the control circuit 22 is instructed to supply power and the IPD 2 is shut off the supply regardless of the turning on/off instruction, the control unit 38 determines that the supply of power to the load 12 is abnormal, and specifies a current detection-related failure as the reason of the abnormality.

If the load current value is normally a high-level current value but the load voltage value is a low-level voltage value when the control circuit 22 is instructed to supply power and the IPD 2 is not shutting off the supply regardless of the turning on/off instruction, the control unit 38 determines that the supply of power to the load 12 is abnormal, and specifies a short circuit of the load 12 as the reason of the abnormality. The short circuit of the load 12 specified here means that one end of the load 12 on the battery 11 side is grounded.

If the load current value is normally a low-level current value but the load voltage value is a high-level voltage value when the control circuit 22 is instructed to supply power and the IPD 2 is shutting off the supply regardless of the turning on/off instruction, the control unit 38 determines that the supply of power to the load 12 is abnormal, and specifies a short circuit of the load 12 as the reason of the abnormality. The short circuit of the load 12 specified here is a short circuit that occurs because one end of the load 12 is directly connected to the positive terminal of the battery 11.

If the load voltage value is normally a high-level voltage value but the load current value is a low-level current value when the control circuit 22 is instructed to supply power and the IPD 2 is not shutting off the supply regardless of the turning on/off instruction, the control unit 38 determines that the supply of power to the load 12 is abnormal, and specifies opening (disconnection) of the load 12 or a current detection-related failure as the reason of the abnormality.

If the load current value is a low-level current value and the load voltage value is a low-level voltage value when the control circuit 22 is instructed to supply power and the IPD 2 is shutting off the supply regardless of the turning on/off instruction, the control unit 38 determines that the supply of power to the load 12 is normal.

If the load current value is a low-level current value and the load voltage value is a low-level voltage value although the control circuit 22 is instructed to supply power and the IPD 2 is not shutting off the supply of power regardless of the turning on/off instruction, the control unit 38 determines that the supply of power to the load 12 is abnormal, and specifies opening (disconnection) of the FET 20 as the reason of the abnormality. "Opening of the FET 20" means that the FET 20 is always in the off state regardless of the voltage applied to the gate.

The storage unit 36 has stored in advance the relationship between the control states and the determination of an abnormality in supply of power, and the relationship between the control states and the reasons of the abnormality, as shown in FIG. 4. The control unit 38 determines whether or not the supply of power is abnormal, and specifies the reason of the abnormality, by applying the present control state stored in the storage unit 36 to the above-described relationship stored in advance in the storage unit 36.

As described above, the control unit 38 determines whether or not the supply of power is abnormal based on whether the power supply/shutoff instruction that is output to the control circuit 22 of the IPD 2 is to supply power or to shut off the supply of power, the value of the current detected by the current detection unit 21, the value of a voltage divided by the resistors R1 and R2, and the detection result of the operation state of the IPD 2. Furthermore, if it is determined that the supply of power is abnormal, the control unit 38 specifies the reason of the abnormality based on whether the power supply/shutoff instruction that is output to the control circuit 22 is to supply power or to shut off the supply of power, the value of the current detected by the current detection unit 21, the value of a voltage divided by the resistors R1 and R2, and the detection result of the operation state of the IPD 2.

Accordingly, the control unit 38 can appropriately determine whether or not the supply of power from the battery 11 to the load 12 is abnormal, and can specify the detailed reason of the abnormality. Accordingly, in the event of supply of power being abnormal, the user can easily find the position of the abnormality, and thus can perform a repair in a short time period. The control unit 38 serves as determination means and specification means as well.

Furthermore, if a current detection-related failure is specified as the reason of the abnormality, the control unit 38 will instruct the output unit 35 to output, to the control circuit 22, the power supply/shutoff instruction to shut off the supply, and the control circuit 22 will shut off the supply of power from the battery 11 to the load 12, preventing the control circuit 22 from erroneously shutting off the supply due to the current detection-related failure.

Embodiment 2

Figure 5:
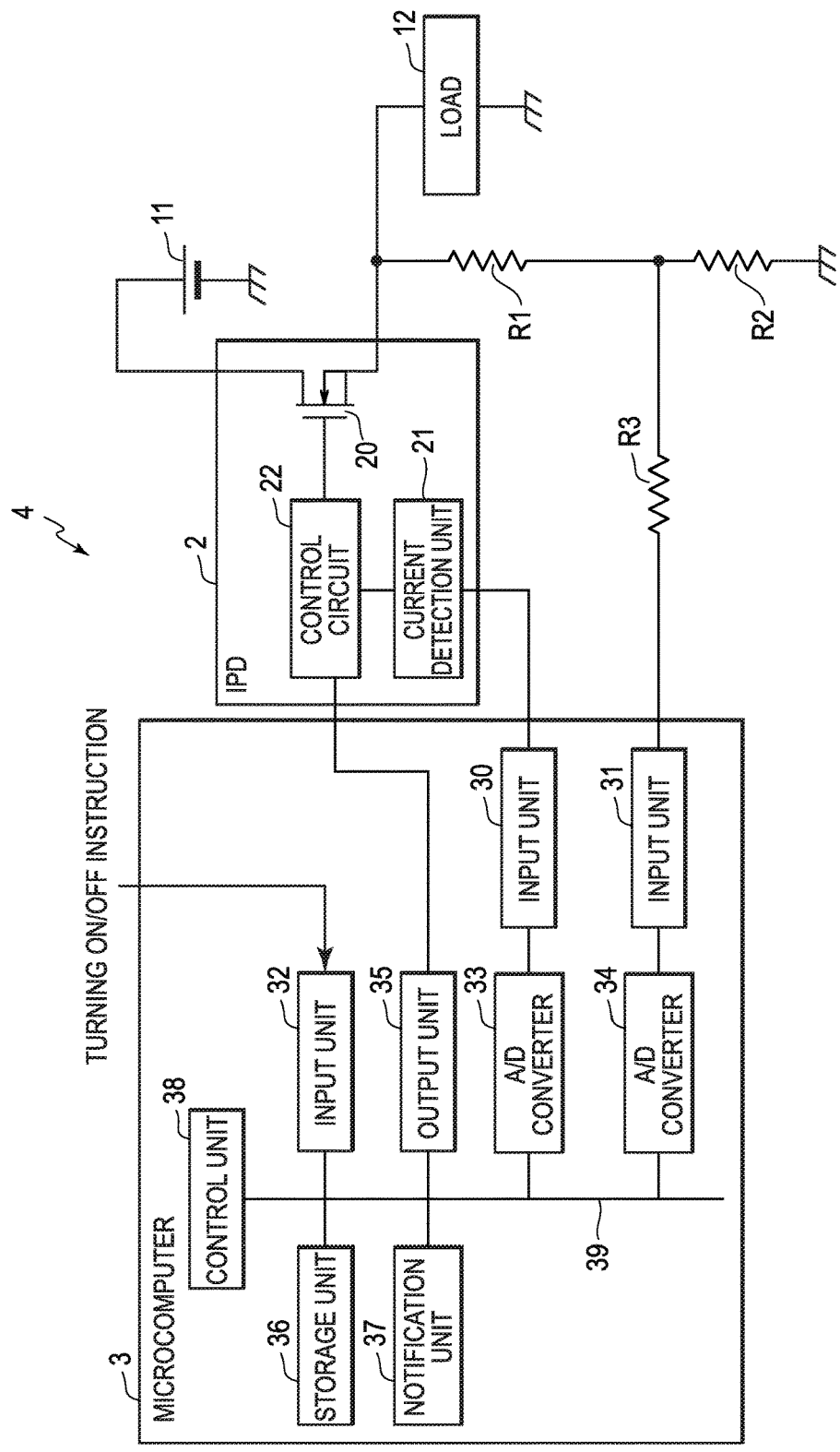
FIG. 5 is a block diagram illustrating a configuration of a main part of a control system according to Embodiment 2.

FIG. 5 is a block diagram illustrating a configuration of a main part of a control system 4 according to Embodiment 2. The control system 4 differs from the control system 1 of Embodiment 1 in that the control circuit 22 of the IPD 2 does not shut off supply of power from the battery 11 to the load 12 regardless of a power supply/shutoff instruction that is output from the output unit of the microcomputer 3. Accordingly, the control unit 38 does not use the detection result relating to whether or not the control circuit 22 is shutting off the supply regardless of a power supply/shutoff instruction for determination of an abnormality in the supply of power and specification of the reason of the abnormality.

The following will describe the difference of the control system 4 of Embodiment 2 from the control system 1 of Embodiment 1. The same reference numerals are given to the configuration of Embodiment 2 common to those of Embodiment 1, and detailed descriptions thereof are omitted.

The control system 4 of Embodiment 2 includes the same constituent components as those of the control system 1 of Embodiment 1, and these constituent components are connected to each other in the same manner as with the constituent components of the control system 1 except for the control circuit 22 of the IPD 2 and the input unit 32 of the microcomputer 3 being not connected to each other.

Similarly to Embodiment 1, the IPD 2 and the microcomputer 3 of Embodiment 2 respectively serve as the power supply control device and the instruction output device.

Similarly to Embodiment 1, the current detection unit 21 of the IPD 2 detects a load current flowing from the battery 11 to the load 12, and outputs analog current value data indicating the detected load current value to the input unit 30 of the microcomputer 3. The current detection unit 21 serves as the current detection means also in Embodiment 2.

If the power supply/shutoff instruction input from the output unit 35 of the microcomputer 3 is to supply power, the control circuit 22 of the IPD 2 turns the FET 20 on and supplies power to the load 12. If the power supply/shutoff instruction input from the output unit 35 is to shut off the supply, the control circuit 22 turns the FET 20 off and shuts off the supply of power to the load 12.

However, in contrast to Embodiment 1, the control circuit 22 neither shuts off the supply of power from the battery 11 to the load 12 regardless of the power supply/shutoff instruction based on the load current value detected by the current detection unit 21, nor outputs a shutoff signal and a cancellation signal to the input unit 32 of the microcomputer 3.

The turning on/off instruction is input to the input unit 32 from the outside, and the input unit 32 notifies the control unit 38 of whether the input turning on/off instruction is an instruction to turn on or an instruction to turn off. The input unit 32 serves as input means also in Embodiment 2.

The control unit 38 of Embodiment 2 differs from the control unit 38 of Embodiment 1 in that determination of an abnormality and specification of a reason of the abnormality are performed based on whether the power supply/shutoff instruction that is output from the output unit 35 to the control circuit 22 of the IPD 2 is to supply power or to shut off the supply of power, the load current value that is indicated by the current value data converted by the A/D converter 33, and the voltage value converted by the A/D converter 34.

Furthermore, similarly to Embodiment 1, the control unit 38 determines whether or not the supply of power from the battery 11 to the load 12 is to be shut off, based on the load current value detected by the current detection unit 21. If it is determined that the supply of power is to be shut off, the control unit 38 instructs the output unit 35 to output, to the control circuit 22, the power supply/shutoff instruction to shut off the supply regardless of the turning on/off instruction input to the input unit 32. In response thereto, the control circuit 22 turns the FET 20 off and shuts off the supply of power from the battery to the load, making it possible to prevent, for example, the electric wire connecting the battery 11 and the load 12 from emitting smoke.

The control unit 38 serves as the second determination means also in Embodiment 2.

The storage unit 36 stores, as the present control state, three of the four items described in Embodiment 1 that excludes the operation state of the IPD 2.

The input units 30 and 31, the A/D converters 33 and 34, the output unit 35, and the notification unit 37 of the Embodiment 2 operate similarly to those of Embodiment 1. Accordingly, also in Embodiment 2, the input unit 31 serves as the voltage detection means, and the notification unit 37 serves as the notification means. Accordingly, it is possible for the user to recognize an abnormality in the supply of power from the battery 11 to the load 12, and the reason of this abnormality.

Figure 6:
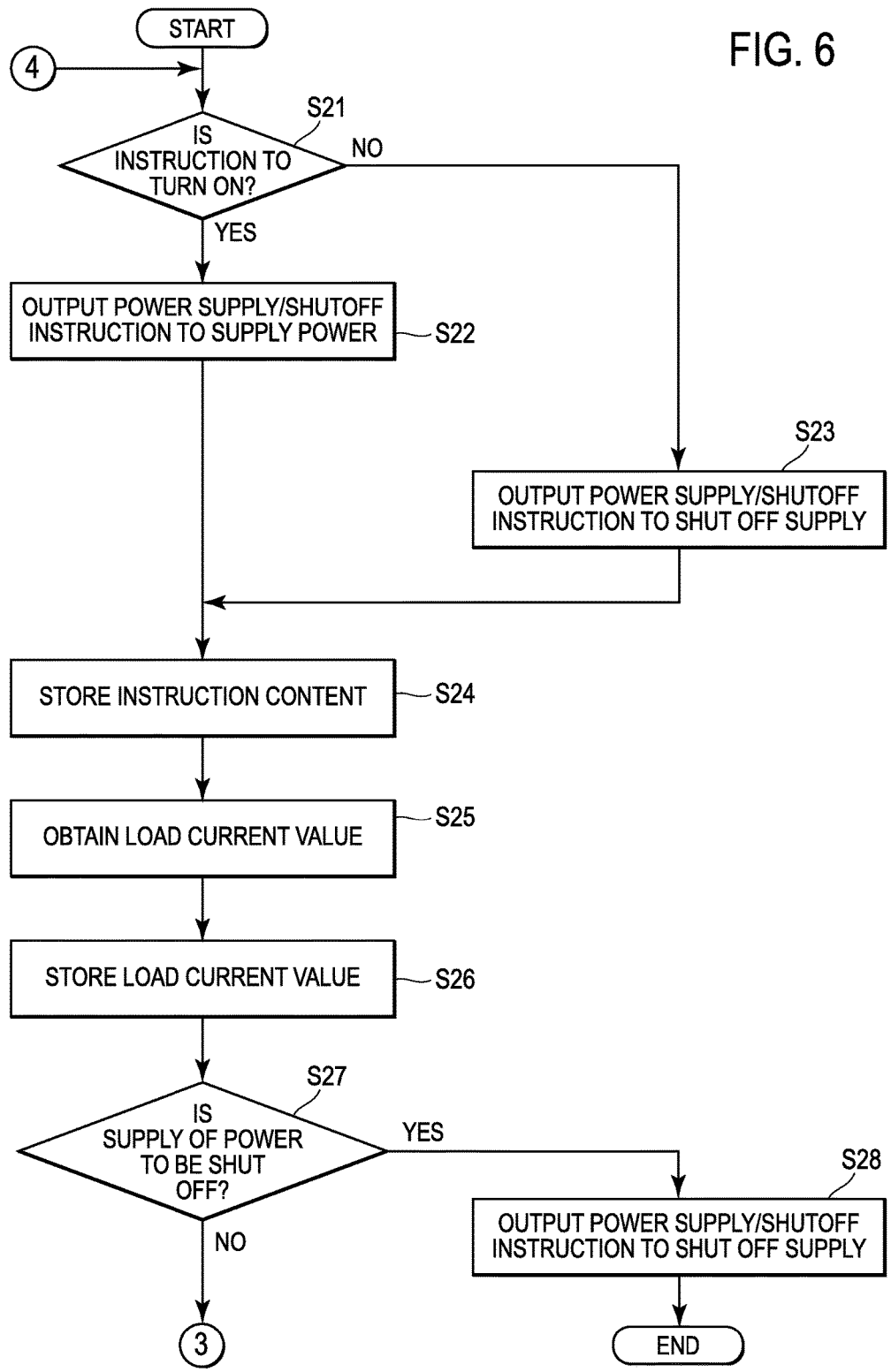
FIG. 6 is a flowchart illustrating a procedure of an operation executed by a control unit.
Figure 7:
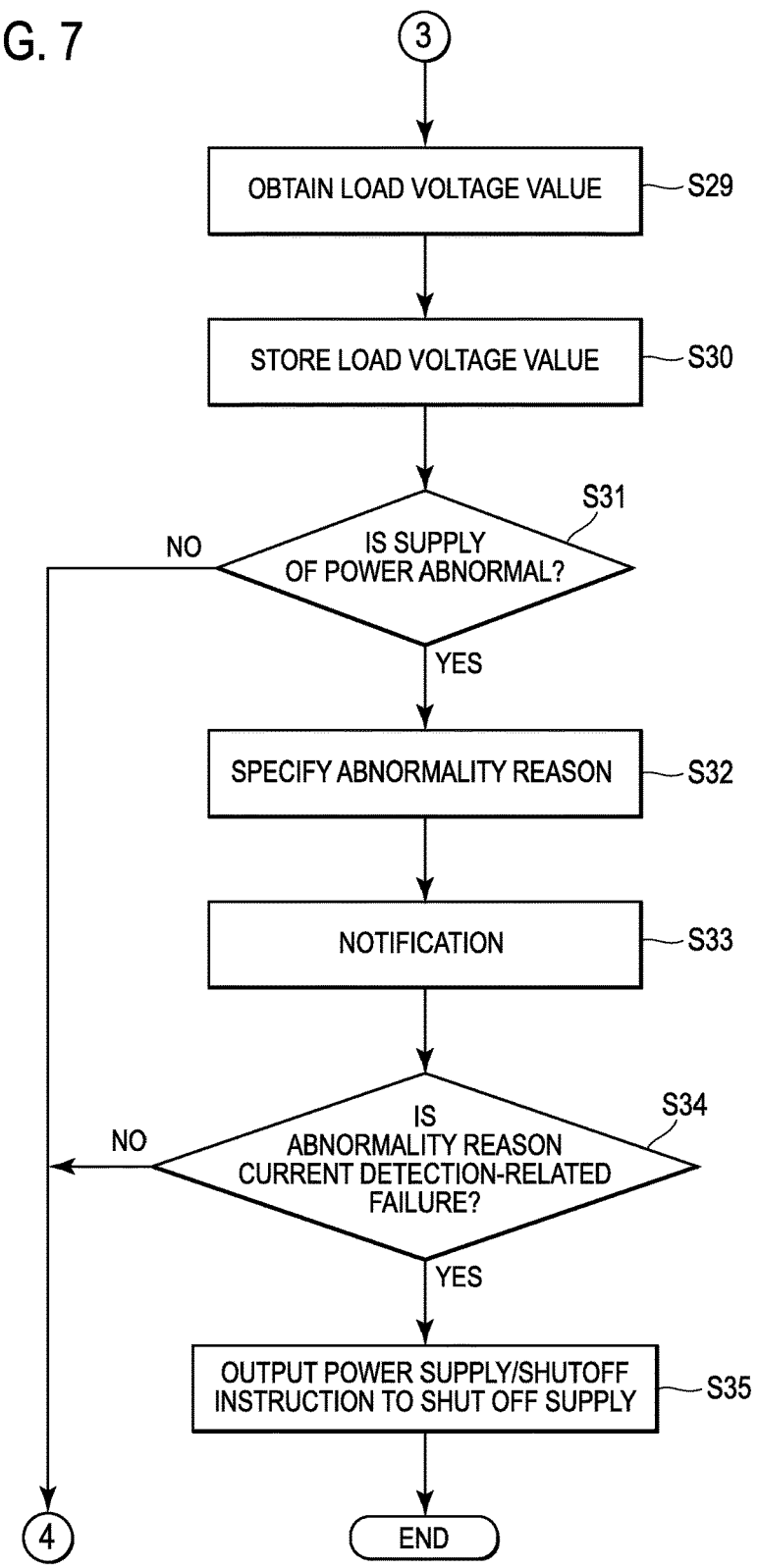
FIG. 7 is a flowchart illustrating a procedure of the operation executed by the control unit.

FIGS. 6 and 7 are flowcharts illustrating procedures of operation that is executed by the control unit 38. Steps S21, S22, S23 to S30, and S33 to S35 of Embodiment 2 that are executed by the control unit 38 are respectively the same as steps S1, S2, S5 to S12, and S15 to S17 of Embodiment 1 that are executed by the control unit 38. Therefore, detailed descriptions of steps S21 to S30, and S33 to S35 will be omitted. Note that the control unit 38 executes step S24 after the execution of step S22 or S23.

After the execution of step S30, the control unit 38 of Embodiment 2 determines, based on the present control states stored in steps S24, S26, and S30, whether or not the supply of power from the battery 11 to the load 12 is abnormal (step S31). The determination of an abnormality that is executed in step S31 will be described later.

If it is determined that the supply of power is not abnormal (NO in step S31), the control unit 38 returns the procedure to step S21, and performs supply of power from the battery 11 to the load 12 or shut-off of the supply of power depending on the turning on/off instruction input to the input unit 32. If it is determined that the supply of power is abnormal (YES in step S31), the control unit 38 specifies the reason of the abnormality based on the present control states stored in the storage unit 36 (step S32). The specification of the reason of the abnormality will also be described later, similarly to the determination of an abnormality. The control unit 38 executes step S32, and then step S33.

The determination of an abnormality and the reason of the abnormality that are executed by the control unit 38 in steps S31 and S32 will be described. FIG. 8 shows a table for illustrating determination of an abnormality and specification of the reason of the abnormality. FIG. 8 shows whether the supply of power to the load 12 is abnormal or normal, and the reasons of the abnormality with respect to the control states that the control system 4 can hold. The control state is indicated with the content of the instruction given to the control circuit 22 of the IPD 2 by the control unit 38, the load current value, and the load voltage value. In FIG. 8, similarly to FIG. 4, a high-level load current value is denoted with "H", and a low-level load current value is denoted with "L". In FIG. 8, the high-level load voltage value as well is denoted with "H", and the low-level load voltage value is denoted with "L".

In Embodiment 2, the control circuit 22 of the IPD 2 does not shut off the supply of power from the battery 11 to the load 12 regardless of the power supply/shutoff instruction input from the output unit 35 of the microcomputer 3. Accordingly, the relationship among control states, determination of an abnormality, and reasons of the abnormality in FIG. 8 is a relationship that is obtained by removing the columns of control states, determination of an abnormality, and reasons of the abnormality when the operation state of the IPD 2 shows shut-off of the supply, from the relationship among control states, determination of an abnormality, and reasons of the abnormality shown in FIG. 4.

Also in Embodiment 2, the storage unit 36 stores in advance the relationship between the control states and the determination of an abnormality in the supply of power as shown in FIG. 8, and the relationship between the control states and the reasons of the abnormality. The control unit 38 determines whether or not the supply of power is abnormal, and specifies the reason of the abnormality, by applying the present control state stored in the storage unit 36 to the above-described relationship stored in advance in the storage unit 36.

As described above, the control unit 38 determines whether or not the supply of power is abnormal based on whether the power supply/shutoff instruction that is output to the control circuit 22 of the IPD 2 is to supply power or to shut off the supply of power, the value of the current detected by the current detection unit 21, and the value of a voltage divided by the resistors R1 and R2. Furthermore, if it is determined that the supply of power is abnormal, the control unit 38 specifies the reason of the abnormality based on whether the power supply/shutoff instruction that is output to the control circuit 22 is to supply power or to shut off the supply of power, the value of the current detected by the current detection unit 21, and the value of a voltage divided by the resistors R1 and R2.

Accordingly, the control unit 38 can appropriately determine whether or not the supply of power from the battery 11 to the load 12 is abnormal, and can specify the detailed reason of the abnormality. Accordingly, in the event of an abnormality in the supply of power, the user can easily find the position of the abnormality, achieving a repair for a short time. The control unit 38 serves as the determination means and the specification means as well also in Embodiment 2.

Furthermore, similarly to Embodiment 1, if a current detection-related failure is specified as the reason of the abnormality, the control unit 38 instructs the output unit 35 to output, to the control circuit 22, the power supply/shutoff instruction to shut off the supply, and thus it is possible to prevent the control circuit 22 from erroneously shutting off the supply due to the current detection-related failure.

Note that in Embodiments 1 and 2, the control unit 38 may not necessarily determine, based on the load current value detected by the current detection unit 21, whether or not the supply of power from the battery 11 to the load 12 is to be shut off.

In this case, the control unit 38 of Embodiment 1 executes step S8 and then step S11, and the control unit 38 of Embodiment 2 executes step S26 and then step S29. None of the control units 38 of Embodiments 1 and 2 instructs the output unit 35 to output, to the control circuit 22 of the IPD 2, the power supply/shutoff instruction to shut off the supply regardless of the turning on/off instructions input to the input unit 32.

Also in the control systems 1 and 4 having such configurations, the control units 38 can appropriately determine whether or not the supply of power from the battery 11 to the load 12 is abnormal, and can specify the detailed reason of the abnormality. Furthermore, due to the operation of the notification unit 37, it is possible for the user to recognize an abnormality in the supply of power from the battery 11 to the load 12, and the reason of this abnormality.

Furthermore, since, in Embodiments 1 and 2, the FET 20 only needs to serve as a switch, a switch such as a P-channel type FET or a bipolar transistor may be used instead of the FET 20.

The disclosed Embodiments 1 and 2 are examples in all aspects and are not to be construed as limiting. The scope of the present invention is defined by not the above-described description but the claims, and all modifications in the scope or equivalent to the claims are intended to be included.

LIST OF REFERENCE NUMERALS 1, 4 Control system
11 Battery
12 Load
2 IPD (power supply control device)
21 Current detection unit (current detection means)
22 Control circuit (shutoff means)
3 Microcomputer (instruction output device)
31 Input unit (voltage detection means)
32 Input unit (input means)
37 Notification unit (notification means)
38 Control unit (determination means, second determination means, specification means, detection means)

The invention claimed is:

1. A control system comprising:
a power supply controller configured to supply and shut off power from a battery to a load in accordance with a power supply/shutoff instruction; and
an instruction output device configured to output the power supply/shutoff instruction to the power supply controller,
wherein the power supply controller comprises:
a current detector configured to detect a current flowing from the battery to the load, and
the instruction output device comprises:
a voltage detector configured to detect a voltage applied to the load;
a determination controller configured to determine whether or not the supply of power is abnormal, based on (i) whether the power supply/shutoff instruction that is output to the power supply controller is to supply power or to shut off the supply of power, (ii) a value of the current detected by the current detector, and (iii) a value of the voltage detected by the voltage detector; and
a specification controller configured to specify a reason of the abnormality, if it is determined by the determination controller that the supply of power is abnormal, based on (i) whether the power supply/shutoff instruction output to the power supply controller is to supply power or to shut off the supply of power, (ii) the value of the current detected by the current detector, and (iii) the value of the voltage detected by the voltage detector.

2. The control system according to claim 1,
wherein the power supply controller further includes a shutoff controller configured to shut off the supply of power regardless of the power supply/shutoff instruction that is output by the instruction output device, if the value of the current detected by the current detector is a predetermined value or more,
the instruction output device further includes a shutoff detector configured to determine whether or not the shutoff controller is shutting off the supply of power,
the determination controller determines whether or not the supply of power is abnormal, based on whether the power supply/shutoff instruction that is output to the power supply controller is to supply power or to shut off the supply of power, the value of the current detected by the current detector, the value of the voltage detected by the voltage detector, and a result of the detection of the shutoff detector, and
the specification controller specifies the reason based on (i) whether the power supply/shutoff instruction output to the power supply controller is to supply power or to shut off the supply of power, (ii) the value of the current detected by the current detector, (iii) the value of the voltage detected by the voltage detector, and (iv) the result of the detection of the shutoff detector.

3. The control system according to claim 2,
wherein the instruction output device further includes a notification device configured to issue a notification of the reason specified by the specification controller, if it is determined by the determination controller that the supply of power is abnormal.

4. The control system according to claim 3,
wherein the instruction output device further includes:
an input device configured to receive an instruction for turning on/off the load; and
a second determination controller configured to determine whether or not the supply of power is to be shut off, based on the value of the current detected by the current detector, and
the instruction output device outputs, to the power supply controller, the power supply/shutoff instruction that corresponds to the turning on/off instruction input to the input device, and if it is determined by the second determination controller that the supply of power is to be shut off, the instruction output device outputs, to the power supply controller, the power supply/shutoff instruction to shut off the supply of power regardless of the turning on/off instruction input to the input device.

5. The control system according to claim 1,
wherein the instruction output device further includes a notification device configured to issue a notification of the reason specified by the specification controller, if it is determined by the determination controller that the supply of power is abnormal.

6. The control system according to claim 1,
wherein the instruction output device further includes:
an input device configured to receive an instruction for turning on/off the load; and
a second determination controller configured to determine whether or not the supply of power is to be shut off, based on the value of the current detected by the current detector,
the instruction output device outputs, to the power supply controller, the power supply/shutoff instruction that corresponds to the turning on/off instruction input to the input device, and if it is determined by the second determination controller that the supply of power is to be shut off, the instruction output device outputs, to the power supply controller, the power supply/shutoff instruction to shut off the supply of power regardless of the turning on/off instruction input to the input device.

* * * * *